United States Patent [19]

Darrow

[11] 4,130,764
[45] Dec. 19, 1978

[54] FAIL-SAFE OR LOGIC CIRCUIT

[75] Inventor: John O. G. Darrow, Murrysville, Pa.

[73] Assignee: Westinghouse Air Brake Company, Swissvale, Pa.

[21] Appl. No.: 819,660

[22] Filed: Jul. 27, 1977

[51] Int. Cl.² .................... H03K 19/02; H03K 19/30
[52] U.S. Cl. .................................. 307/218; 307/363; 328/92
[58] Field of Search .................. 307/218, 363; 328/92

[56] References Cited

U.S. PATENT DOCUMENTS 3,422,284  1/1969  Martin .................................. 307/218

Primary Examiner—John Zazworsky
Attorney, Agent, or Firm—J. B. Sotak; R. W. McIntire, Jr.

[57] ABSTRACT

A fail-safe "OR" logic gate circuit which includes at least a first and a second level detector each of which has a voltage breakdown device and an oscillating circuit, a resonant tank circuit connected in common with each of the oscillating circuits, an amplifying circuit coupled to each oscillating circuit, and a regulating-rectifying circuit coupled to the amplifying circuit and producing a d.c. output signal when a d.c. input signal causes either or both of the voltage breakdown devices to breakdown and to exhibit a low impedance for causing the oscillating circuits to oscillate and supply a.c. signals to the amplifying circuit for rectification by the regulating-rectifying circuit.

11 Claims, 1 Drawing Figure

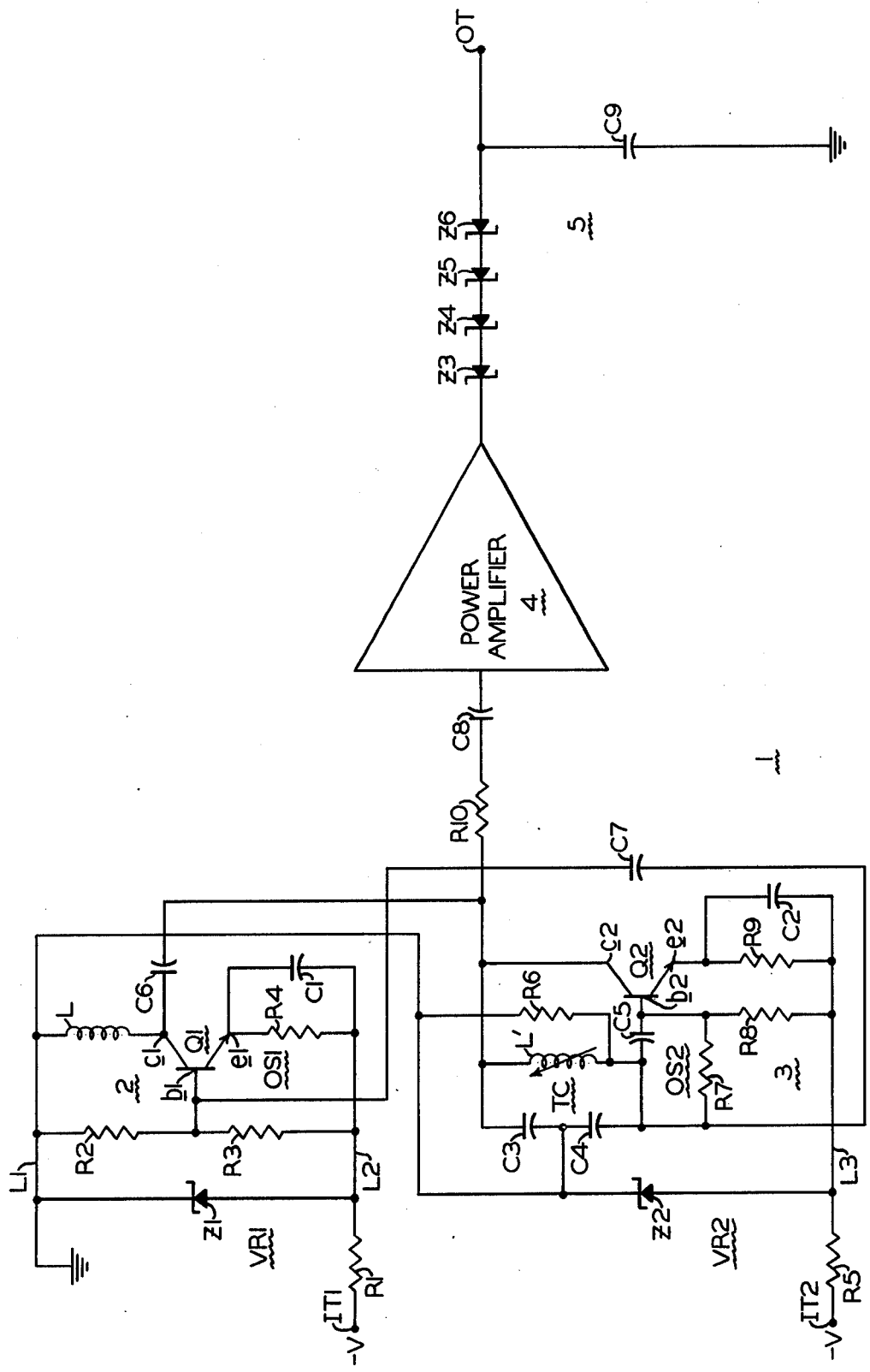

FAIL-SAFE OR LOGIC CIRCUIT

FIELD OF THE INVENTION

This invention relates to a vital type of electronic logic circuit and, more particularly, to a fail-safe "OR" gate employing a pair of oscillating-type of semiconductor level detectors each of which is connected to a common resonant tank circuit for determining the frequency of oscillation when either one or both of the level detectors are energized and results in the production of a.c. oscillations which are amplified and rectified to produce a d.c. output voltage.

BACKGROUND OF THE INVENTION

It is well known that certain transistorized logic circuits, such as, "OR" gates, "AND" gates, etc., are used extensively in digital computing, communications and data handling equipment as well as in other electronic systems and apparatus. For example, the presently disclosed solid-state logic circuit finds particular utility in a vital-type automatic vehicle speed control system for railroad and mass and/or rapid transit operations. In vehicular speed control systems of this type, it is of vital and utmost importance, and in many cases an authoratative requirement, to ensure that certain circuit sections or portions of the control system must operate in a fail-safe fashion. It will be appreciated that in fail-safe operation, a circuit malfunction or component failure must result either in a more restrictive condition or in a condition which is as safe as that preceding the failure.

While numerous nonvital static gates, such as, "OR" logic circuits, are well known in the art, it is readily apparent that these conventional logic circuits are possessed of certain shortcomings which make their direct application to an automatic vehicle speed control system normally unacceptable and generally unsuitable for railroad and transit operation. For example, these standard nonvital solid-state "OR" gates operate in an unsafe manner in that a false output can be produced when a component or circuit failure occurs. The opening or the short circuiting of an inductor, capacitor, resistor, diode, or transistor or the corssing or the loss of a lead or conductor can result in an erroneous output in an ordinary and conventional solid-state "OR" logic circuit. Further, a change or variation in the resistive, capacitive or inductive value of a component or element can cause a fluctuation in the amplitude of an output signal and can result in spurious signals. In one instance, it was found to be advantageous to utilize a plurality of vital level detectors of the oscillating type to make up an "OR" logic gate for a vehicle speed control system to determine if either of two inputs was present in the required amount. However, upon further experimentation, it was discovered that a problem occurred when two or more oscillating level detectors were separately coupled to an amplifier gate. If both of the oscillating level detectors are turned on or rendered conductive, any difference in the frequencies of oscillations results in the production of a beat frequency. If the output of the "OR" gate is employed in a certain application, such as, in a vital vehicle speed control system, the introduction of the resultant low frequency beat signal into the system is wholly unacceptable and can cause an unsafe condition. Thus, it is mandatory in a fail-safe or vital speed control system to ensure that a beat frequency is not produced by a logic circuit employing a plurality of oscillating level detectors.

OBJECTS OF THE INVENTION

Accordingly, it is an object of this invention to provide an improved fail-safe solid-state "OR" logic circuit.

Another object of this invention is to provide a unique vital "OR" gate employing a plurality of oscillating types of level detectors.

A further object of this invention is to provide a fail-safe "OR" gate utilizing a pair of oscillating level detectors, an amplifier gate and a regulating rectifier.

Yet another object of this invention is to provide a unique fail-safe logic circuit for producing an output signal when either a first input or a second input or both of the first and the second inputs are present.

Yet a further object of this invention is to provide a novel vital "OR" gate having a first and a second oscillating type of level detecting means supplying an a.c. input to an amplifying means which is fed to an output means to produce an output signal when an input signal is applied to either or both of the level detectors.

Still another object of this invention is to provide an improved fail-safe logic circuit having a pair of level detectors each of which includes a voltage breakdown device and an oscillating circuit having a common resonant circuit for determining the frequency of a.c. oscillations which are amplified and rectified to produce a d.c. supply voltage when either one or both of the level detectors are energized by d.c. input voltage.

Still a further object of this invention is to provide a vital logic circuit including at least a first and a second fail-safe level detector with each of the level detectors including a voltage breakdown device and an oscillating circuit, a frequency determining circuit connected in common with each of the oscillating circuits, an amplifying circuit coupled to each of the oscillating circuits, and a regulating rectifier connected to the amplifying circuit and producing a d.c. output signal either when a d.c. input signal exceeds the breakdown voltage of one of the breakdown devices of the first and second level detectors or when d.c. input signals exceed the breakdown devices of the first and second level detectors.

An additional object of this invention is to provide a new and improved "OR" logic gate which is simple in design, economical in cost, reliable in construction, durable in service, dependable in use and efficient in operation.

SUMMARY OF THE INVENTION

In accordance with this invention, there is provided a fail-safe "OR" logic gate for use in a vital vehicle speed control system for railroad and mass and/or rapid transit operation. The fail-safe "OR" gate includes a pair of electronic level detectors, a power amplifier and a regulating rectifier. Each of the electronic level detectors includes a shunt regulator and regenerative feedback oscillator. Each of the shunt regulators includes a current-limiting resistor and a Zener diode. One end of each of the current-limiting resistors is connected to a separate terminal of a negative d.c. input signal source while the other end of each of the resistors is connected to the anode electrode of the respective Zener diodes. The cathode electrode of each of the Zener diodes is connected to a reference potential. Each of the regenerative feedback oscillators includes a semiconductive amplifier stage having an NPN transistor. The transistor forms the active element of a Colpitts type of oscillator.

Each of the transistor oscillators includes a biasing circuit which provides d.c. operating voltages to the transistor electrodes from the respective current limiting resistors. An L-C resonant tank circuit is coupled in common to each transistor oscillator for determining the frequency of oscillation. The output of each of the transistor oscillators is coupled to the input of the power amplifier via a series connected resistor and capacitor. The output of the power amplifier is connected to the regulating rectifier which includes a plurality of series Zener diodes and a shunt filtering capacitor. Accordingly, when a negative d.c. input signal voltage is applied to either or both of the input current limiting resistors, one or both of the Zener diodes will breakdown and conduct. The conduction of the respective Zener diode causes the necessary d.c. operating potentials to be supplied to the respective transistor oscillator and establishes a low impedance feedback path which causes either or both to go into oscillation. The frequency of the a.c. oscillations is determined by the inductance and capacitance values of the L-C resonant tank circuit which is common to each transistor oscillator. Thus, the frequency of the a.c. oscillations will be the same if either one or both of the transistor oscillators are rendered conductive by the presence of the associated negative d.c. input voltage. The a.c. oscillations are conveyed by the series resistor and capacitor to the input of the power amplifier which amplifies and feeds to a.c. signals to the regulating rectifier. The series connected Zener diodes recitfy the amplified a.c. signal to produce a negative d.c. output signal when either or both input signals are present.

BRIEF DESCRIPTION OF THE DRAWING

Other objects, features and advantages of this invention will become more readily apparent from the following description of the preferred embodiment when read with reference to and considered in conjunction with the accompanying drawing which forms a part of this specification, in which:

The single or sole FIGURE in the drawing is a schematic circuit diagram of a fail-safe solid-state "OR" logic circuit in accordance with the present invention.

DETAILED DESCRIPTION OF THE INVENTION

Referring now to the single FIGURE of the drawing, there is shown a vital type of a two input electronic "OR" gate circuit, generally characterized by numeral 1, which includes a pair of level detectors or detecting means 2 and 3, a power amplifier or amplifying means 4 and an output regulating rectifier or output means 5.

As previously mentioned, the present invention has evolved as a result of the inability to utilize a conventional type of an "OR" gate in a vital vehicular speed control system. Specifically, oscillating types of prior art logic circuits have certain shortcomings which do not comform with fail-safe practices and principles. The "OR" logic circuit of the present invention may be broadly considered as a two input signal passing gate. That is, when either or both of a pair of input signals are present, an output signal exists, and when neither of the pair of input signals is present, an output signal does not exist. As will become more readily apparent hereinafter, it is necessary to ensure that under no circumstance should a false or erroneous output exist when a circuit or component fails. That is, in order to provide fail-safe operation, it is essential that a false output signal not be produced when a component or circuit malfunction occurs.

Turning now to the details of the vital logic circuit, it will be seen that the "OR" gate 1 includes two separate input terminals IT1 and IT2 and one output terminal OT. It will be understood that the number of inputs may be obviously increased if needed and that the input voltages or signals applied to terminals IT1 and IT2 are negative d.c. signals $-V$ of a sufficient amplitude which exceeds the breakdown or avalanche value of a Zener diode, as will be explained hereinafter.

As shown, the first level detector 2 includes a shunt voltage regulator VR1 having a current-limiting resistor R1 and a voltage breakdown device or Zener diode Z1. It will be observed that one end of resistor R1 is connected to the first negative voltage input terminal IT1 of a suitable source of potential (not shown) while the other end of resistor R1 is connected to the anode of Zener diode Z1. The cathode electrode of Zener diode Z1 is connected to a reference potential or ground via lead L1. The voltage regulator VR1 supplies the necessary operating and biasing potentials for the Colpitts type of solid-state oscillator OS1 of the first level detector 2. The regulated voltage developed across Zener diode Z1 is applied to a voltage divider including resistors R2 and R3. It will be seen that the upper end of resistor R2 is connected to ground lead L1 while the lower end of resistor R3 is connected to the negative voltage lead L2. the Colpitts oscillator OS1 includes a solid-state device or NPN transistor Q1 having a common emitter electrode e1, an output collector electrode c1 and an input base electrode b1. As shown, the base electrode b1 is directly connected to the junction point formed between voltage dividing resistors R2 and R3. The collector electrode c1 is connected to the ground lead L1 via choke coil L which exhibits a high impedance at the frequency of oscillations. The emitter electrode e1 is connected through resistor R4 to supply lead L2. A by-pass capacitor C1 is connected in parallel with resistor R4.

As shown, the second level detector 3, which may be of the type shown and described in my U.S. Letters Pat. No. 3,737,806, includes a shunt voltage regulator VR2 having a current-limiting resistor R5 and a voltage breakdown device or Zener diode Z2. It will be observed that one end of resistor R5 is connected to the second negative voltage input terminal IT2 while the other end of resistor R5 is connected to the anode electrode of Zener diode Z2. The cathode electrode of Zener diode Z2 is directly connected to ground lead L1. The voltage regulator VR2 supplies the necessary operating and biasing voltages for the second Colpitts oscillator OS2. The regulated voltage developed across Zener diode Z2 is applied to a voltage dividing network consisting of resistors R6, R7 and R8. It will be seen that the upper end of resistor R6 is connected to ground lead L1 while the lower end of resistor R8 is connected to the negative voltage lead L3. The Colpitts oscillator OS2 includes an NPN transistor or amplifying semiconductor element Q2 having a common emitter electrode e2, an output collector electrode c2 and an input base electrode b2. As shown, the base electrode b2 is directly connected to the junction point formed between the series-connected resistors R7 and R8. The emitter electrode e2 is connected to the negative voltage lead L3 via resistor R9 which is shunted by a by-pass capacitor C2.

As previously mentioned, the frequency determining means or tuned network takes the form of a parallel resonant or tank circuit TC which is tuned to a predetermined frequency by a pair of series-connected capacitors C3 and C4 coupled in parallel with a variable inductor L'. The tuned tank circuit TC is connected in common with both oscillators OC1 and OC2 in order to ensure that a. c. signals or oscillations of only one given frequency will be produced when either one or both of the oscillators are rendered conductive. As shown, the upper end of the tank circuit TC is directly connected to the collector electrode C2 while the lower end of the tank circuit TC is connected to the input base electrode b2 via signal passing capacitor C5. The junction point between capacitors C3 and C4 is directly connected to the cathode electrode of Zener diode Z2 and the cathode electrode of Zener diode Z1 via ground lead L1. The tank circuit TC is also connected to oscillator OS1 via signal passing capacitors C6 and C7. That is, the upper end of tank circuit TC is connected to the collector electrode C1 via coupling capacitor C6 while the lower end of the tank circuit TC is connected to the base electrode b1 via coupling capacitor C7.

The a.c. oscillations or signals are conveyed to the input of the power amplifier 4 via a resistor R10 and a series connector capacitor C8. The amplified a.c. signals derived from transistor amplifier 4 which may include an emitter-follower stage and a grounded-emitter stage are fed to the regulating rectifier network 5. The regulating rectifier 5 includes a plurality of series-connected Zener diodes Z3, Z4, Z5 and Z6 and a filtering capacitor C9. As shown, the cathode electrode of Zener diode Z3 is directly connected to the output of the power amplifier 4 while the anode electrode of diodes Z3, Z4 and Z5 are connected to the cathode of diodes Z4, Z5 and Z6, respectively. The junction between the anode electrode of Zener diode Z6 and the upper plate of capacitor C9 form the output terminal OT while the lower plate of capacitor C9 is connected to ground potential. In practice, the negative voltage appearing on terminal OT is supplied to a fail-safe electronic limiting circuit or solid-state limiter which is part of the vital vehicle speed control system. It will be appreciated that the number of Zener diodes may be increased or decreased depending on their ratings and the magnitude of the voltage required by the load. The purpose of connecting a number of Zener diodes in series is to allow for a stable voltage to be obtained over a wide range of temperature variations. In fact, the Zener diodes Z3, Z4, Z5 and Z6 have been selected to have the same temperature drift as the other temperature sensitive elements of the logic circuit.

Turning now to the operation of the fail-safe "OR" gate, it will be assumed that the components are in tact and functioning properly and that no negative d.c. input voltage is applied to either input terminal IT1 or input terminal IT2. Under such an assumption, no d.c. output signal is present on terminal OT since neither of the oscillators is energized.

Let us now assume that a negative d.c. voltage of a sufficient level is applied to the first input terminal IT1. Under this condition, the magnitude of the negative input voltage is large enough to breakdown and render the Zener diode Z1 conductive so that it exhibits a low dynamic impedance. The regulated voltage developed across Zener diode Z1 remains substantially constant over a wide range of voltage and current variations and provides the various biasing and operating potentials by the voltage dividing resistors R2 and R3 for ensuring stable operation of the transistor oscillator OS1. With the Zener diode Z1 conducting, a low impedance path is established from the junction point between capacitors C3 and C4 through lead L1 through the Zener diode Z1, through by-pass capacitor C1 to the emitter electrode e1. The circuit path is completed by coupling capacitor C7 which is connected to the lower end of the tank circuit TC to the base electrode b1 and capacitor C6 which connects to the top end of the tank circuit TC to collector electrode C1. Accordingly, sufficient regenerative feedback is now provided for the transistor oscillator OS1 so that a.c. oscillations having a frequency determined by the tank circuit TC are generated and appear on collector electrode c1. As is well known, the amplitude of the a.c. signals developed on the collector electrode c1 is a function of the gain of the amplifier transistor Q1 and the feedback signals. It will be seen that the a.c. oscillations on the collector electrode c1 are coupled to the input of the power amplifier 4 via coupling capacitor C6 and series resistor R10 and capacitor C8. It will be seen that the capacitor C6 serves the dual purpose of coupling the output of oscillator OS2 to the power amplifier 4 and also of coupling the oscillator OS1 to the tank circuit TC of oscillator OS2. Thus, oscillator OS1 can only provide an output signal when its frequency is being determined by the tank circuit TC which is therefore the same frequency that is being produced by oscillator OS2. In other words, the frequencies of the output signals of the oscillators OS1 and OS2 are locked together in a vital manner. After being amplified by the power amplifier 4, the a.c. signals are fed to rectifier 5 for conversion to a regulated d.c. output voltage. Thus, a negative d.c. output voltage is developed on terminal OT when a negative d.c. input signal is delivered to input terminal IT1.

Similarly, let us now assume that a negative d.c. input signal appears on input terminal IT2 rather than on terminal IT1. When the d.c. input voltage exceeds the threshold value of the voltage breakdown device, the Zener diode Z2 conducts and presents a low impedance regenerative feedback path for transistor oscillator OS2. The Zener diode Z2 provides the required d.c. biasing and operating voltages for the oscillator OS2 in addition to providing the necessary a.c. feedback circuit for sustaining the a.c. oscillations. Actually, the feedback path extends the junction point between capacitor C3 and C4 of the tank circuit TC, through Zener diode Z2 and through by-pass capacitor C2 to the emitter electrode e2 of transistor Q2 through the emitter-base junction and from the base electrode b2, through coupling capacitor C5 to the lower end of the tank circuit TC. Thus, the transistor oscillator OS2 goes into oscillation and again produces a.c. signals having a frequency determined by LC characteristics of the tank circuit TC. It will be appreciated that the a.c. signals developed on the collector c2 of transistor Q2 are delivered to the input of power amplifier 4 via the series-connected resistor R10 and capacitor C8. After amplification, the a.c. output signals are fed to rectifier 5 which converts the a.c. voltage to a regulated negative d.c. voltage. As mentioned above, the negative d.c. voltage developed on output terminal OT is employed to power a suitable voltage limiter which forms part of the vehicle speed control system.

Now, when a negative d.c. input voltage of a sufficient level is applied to both of the input terminals IT1 and IT2, both of the level detectors 2 and 3 will be rendered conductive and result in the production of a.c. signals, each of which will have the same frequency due to the common frequency determining resonant tank circuit TC. That is, when the two Zener diodes Z1 and Z2 are rendered conductive by the presence of both input voltages —V on terminals IT1 and IT2, the necessary biasing and operating potentials are supplied to the transistors Q1 and Q2. Accordingly, a.c. signals having identical frequencies are developed on the collector electrodes of each transistor Q1 and Q2. The a.c. signals are conveyed via resistor R10 and capacitor C8 to amplifier 4 and, in turn, to rectifier 5 for the development of a regulated negative d.c. output on terminal OT.

Thus, a d.c. output voltage is produced by the fail-safe "OR" logic gate 1 when either or both of the input signals are present. That is, a negative d.c. output signal is only available at terminal OT when the applied d.c. voltage on either or both terminals IT1 and IT2 is of a sufficient amplitude to cause either or both Zener diodes Z1 and Z2 to become conductive and assume its low dynamic impedance condition. It will be appreciated that the unique characteristics of the Zener diodes prevents a short circuit or open circuit from adversely effecting the vitality of the "OR" logic gate 1. Further, a leaky Zener diode fails in a safe manner in that a relatively high dynamic impedance accompanies a conducting Zener diode which avalanches at a reduced level. In addition, the unsafe failure of the other components or elements of the gating circuit results in the deterioration of the necessary amplification or oscillating qualities or causes the loss of circuit integrity or rectification. Accordingly, it will be appreciated that the presently described "OR" logic gate operates in a fail-safe manner in that an erroneous or untrue output signal is incapable of being produced to an unsafe failure.

It will be understood that while this invention finds particular utility in a vehicle speed control system it is readily evident that the invention is not merely limited thereto but may be employed in various other systems and apparatus which require the safety and security inherent in the invention. But regardless of how or where the invention is used, it will be appreciated that various changes may be made by persons skilled in the art without departing from the spirit and scope of the invention. It will also be apparent that other alterations and modifications can be made in the presently described invention and, therefore, it is understood that all changes, equivalents and deviations within the spirit and scope of this invention are herein meant to be included in the appended claims.

Having now described the invention, what I claim as new and desire to secure by Letters Patent, is:

1. A vital logic circuit comprising at least a first and a second fail-safe level detector, each of said first and said second fail-safe level detecting means including a voltage breakdown device and an oscillating circuit, a frequency determining circuit connected in common with each of said oscillating circuits, an amplifying means coupled to each of said oscillating circuits, and an output means connected to said amplifying circuit and producing an output signal either when a d.c. input signal exceeds the breakdown voltage of one of said breakdown devices of said first and second fail-safe level detecting means or when d.c. input signals exceed the breakdown voltages of both of said breakdown devices of said first and said second fail-safe level detecting means.

2. The vital logic circuit as defined in claim 1, wherein said frequency determining circuit is an L-C tank circuit.

3. The vital logic circuit as defined in claim 1, wherein said first oscillating circuit includes a common-emitter Colpitts oscillator.

4. The vital logic circuit as defined in claim 1, wherein said second oscillating circuit includes a common-emitter Colpitts oscillator.

5. The vital logic circuit as defined in claim 1, wherein a current-limiting resistor is connected in series with each of said voltage breakdown devices of said first and second fail-safe level detecting means.

6. The vital logic circuit as defined in claim 1, wherein said frequency determining circuit is capacitively connected to said oscillating circuits of said first and second fail-safe level detecting means such that the loss of the capacitive connection will cause the loss of the output of one of said first and second level detectors thereby guaranteeing that said first and second level detectors are unable to deliver both outputs unless said outputs have substantially the same frequency.

7. The vital logic circuit as defined in claim 1, wherein said output means includes a regulating rectifier voltage breakdown means and a capacitance means.

8. The vital logic circuit as defined in claim 1, wherein each of said oscillating circuits of said first and second fail-safe level detecting means includes a NPN transistor.

9. The vital logic circuit as defined in claim 1, wherein said frequency determining circuit is a parallel resonant network.

10. The vital logic circuit as defined in claim 1, wherein a series resistor and capacitor couples each of said oscillating circuits to said amplifying means.

11. A fail-safe "OR" gate comprising a pair of level detectors, each of which includes a voltage regulator and a regenerative feedback oscillator, each of said regulators including a current-limiting resistor and a voltage breakdown device, each of said regenerative feedback oscillators including a semiconductive amplifier which oscillates at a frequency determined by an L-C resonant circuit, each of said regenerative feedback oscillators connected to a power amplifier which supplies a.c. signals to a regulating rectifier for producing a d.c. output signal when a d.c. input causes either or both of said voltage regulators of said pair of level detectors to breakdown and conduct for causing either or both of said oscillators of said pair of level detectors to oscillate at the frequency determined by said L-C resonant circuit.

* * * * *